(12) United States Patent
Hsu et al.

(10) Patent No.: US 7,038,309 B2
(45) Date of Patent: May 2, 2006

(54) CHIP PACKAGE STRUCTURE WITH GLASS SUBSTRATE

(75) Inventors: Chi-Hsing Hsu, Taipei Hsien (TW); Kenny Chang, Taipei Hsien (TW)

(73) Assignee: VIA Technologies, Inc., Taipei Hsien (TW)

( * ) Notice: Subject to any disclaimer, the term of this patent is extended or adjusted under 35 U.S.C. 154(b) by 158 days.

(21) Appl. No.: 10/643,788

(22) Filed: Aug. 15, 2003

(65) Prior Publication Data

US 2004/0046255 A1    Mar. 11, 2004

(30) Foreign Application Priority Data

Sep. 9, 2002    (TW) .............................. 91214106 U

(51) Int. Cl.
*H01L 23/04*    (2006.01)

(52) U.S. Cl. ..................... 257/698; 257/690; 257/737

(58) Field of Classification Search ................ 257/691, 257/698, 690, 737, 738, 778
See application file for complete search history.

(56) References Cited

U.S. PATENT DOCUMENTS

2002/0033189 A1 * 3/2002 Macris ..................... 136/203
2003/0201521 A1 * 10/2003 Tsai et al. .................. 257/678

* cited by examiner

*Primary Examiner*—Bradley K. Smith
(74) *Attorney, Agent, or Firm*—J.C. Patents

(57) ABSTRACT

The present invention provides a chip package structure, comprising: a glass substrate having a substrate surface; a circuit layer on the substrate surface, wherein the circuit layer comprises an interconnection structure; at least a die on the circuit layer, wherein the die is coupled to the interconnection structure; and a plurality of contacts on the circuit layer, wherein the contacts are coupled to the interconnection structure.

20 Claims, 5 Drawing Sheets

203

204

205

206

207

208

CHIP PACKAGE STRUCTURE WITH GLASS SUBSTRATE

CROSS-REFERENCE TO RELATED APPLICATION

This application claims the priority benefit of Taiwan application serial no. 91214106, filed Sep. 9, 2002.

BACKGROUND OF THE INVENTION

1. Field of the Invention

This invention generally relates to a chip package structure, and more particularly to a chip package structure including a glass substrate.

2. Description of the Related Art

Flip chip technology is widely used for chip packaging. Flip Chip describes the method of electrically and mechanically connecting the die to the package carrier. The package carrier then provides the connection from the die to the exterior of the package. The interconnection between die and carrier in flip chip packaging is made through a conductive bump that is placed directly on the die surface. The bumped die is then flipped over and placed face down, with the bumps electrically and mechanically connecting to the carrier. After the die is mounted, an insulated material is applied between the die and the substrate, around the solder bumps. The insulated material is designed to buffer the stress in the solder joints caused by the difference in thermal expansion between the silicon die and carrier.

The boom in flip chip packaging results both from flip chip's advantages in size, performance, flexibility, reliability, and cost over other packaging methods and from the widely available flip chip materials, equipment, and services. Flip chip connections can use the whole area of the die, accommodating many more connections on a smaller die. Hence, Flip chip technology is suitable for high pin count package. Some of well-known applications of flip chip technology are flip chip ball grid array ("FC/BGA") and flip chip pin grid array ("FC/PGA").

FIG. 1 is the cross-sectional view of a conventional FC/BGA chip package structure. The chip package structure 100 includes a substrate 110, a die 130, and a plurality of bumps 140 and balls 150. The substrate 110 includes a top side 112, bottom side 114, and a plurality of bump pads 116a and ball pads 116b. The die 130 includes an active surface 132 and a corresponding back side 134. The die 130 also has a plurality of die pads 136 on the active surface 132 for the signal outputs of the die 130, wherein the positions of the bump pads 116a correspond to those of the die pads 136 respectively. The bumps 140 electrically and mechanically connect the bump pads 116a to the die pads 136. The balls 150 are set on the ball pads 116b to electrically and mechanically connect to external circuits.

Referring to FIG. 1, the insulated material 160 is applied between the top side 112 of the substrate 110 and the active surface 132 of the die 130 to protect the exposed portion of the bump pads 116a, the die pads 136 and bumps 140. The insulated material 160 is designed to buffer the stress in the solder joints caused by the difference in thermal expansion between the die 130 and the substrate 110. Hence, the die pads 136 are electrically and mechanically connected to the bump pads 116a via the bumps 140, and are coupled to the ball pads 116b via the wiring inside the substrate 110. Then the balls 150 on the ball pads 116b electrically and mechanically connect to external circuits.

To reduce the production costs and enhance the operation speed, the size of the die and the pitch between the die pads are getting smaller. Hence, the density of the die pads becomes higher. When FC/BGA or FC/PGA technology is applied to a die having high die pad density, a substrate having a high-density layout is required. The well-known dielectric materials of substrates for FC/BGA or FC/PGA include ceramic or organic materials, wherein the organic substrates are the most common substrates. Because of the process limitation of organic substrates, the critical dimensions of the line width and pitch are both 25 µm for the existing organic substrates. Because it is difficult to increase the bonding pad density on the existing organic substrates, when the density of the die pads becomes higher, the existing organic substrates could not meet the requirement of high bonding pad density.

SUMMARY OF THE INVENTION

An object of the present invention is to provide a chip package structure including a glass substrate instead of a conventional organic substrate to provide a high-density circuit layout substrate for a die having high-density die pads, and effectively reduce the cost of the chip packaging.

The present invention provides a chip package structure, comprising: a glass substrate having a substrate surface; a circuit layer on the substrate surface, wherein the circuit layer comprises an interconnection structure; at least a die on the circuit layer, wherein the die is coupled to the interconnection structure; and a plurality of contacts on the circuit layer, wherein the contacts are coupled to the interconnection structure. The die is coupled to the interconnection structure by using flip chip technology or wire bonding technology. Hence, the die can electrically connect to external circuits or devices via the interconnection structure and the contacts.

Because the circuit layer of the chip package structure of the present invention can be fabricated by LCD panel fabricating processes and equipment, the present invention can reduce the costs of the chip packaging and increase the bonding pad density of the substrate. Hence, the chip package structure of the present invention is suitable for having high die pad density.

The above is a brief description of some deficiencies in the prior art and advantages of the present invention. Other features, advantages and embodiments of the invention will be apparent to those skilled in the art from the following description, accompanying drawings and appended claims.

DESCRIPTION OF THE PREFERRED EMBODIMENTS

Figure 2A:
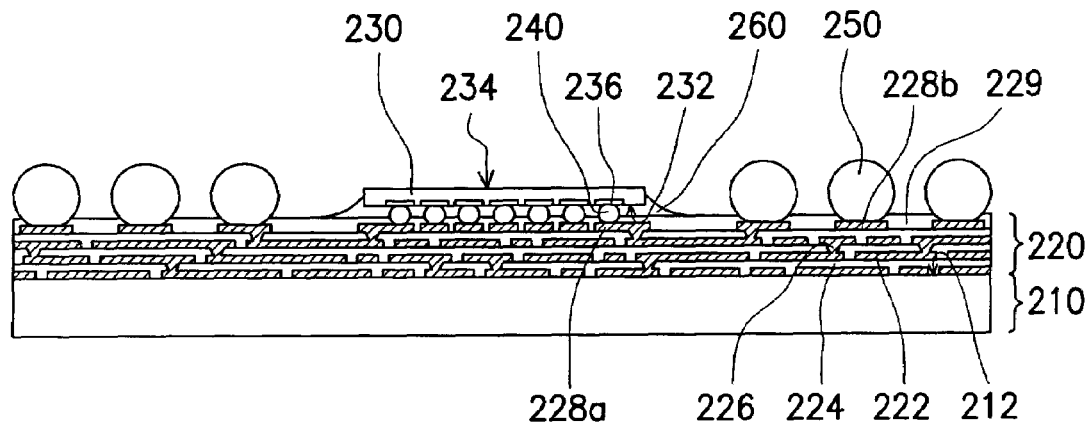
FIGS. 2A–2H are the cross-sectional views of the first to the eighth chip package structures in accordance with preferred embodiments of the present invention.

FIG. 2A is the cross-sectional view of the first chip package structure in accordance with a preferred embodiment of the present invention. The type of the chip package structure 201 is FC/BGA. The chip package structure 201 comprises a glass substrate 210, a circuit layer 220, a die 230, and a plurality of bumps 240 and balls 250. The glass substrate 210 has a substrate surface 212 and the thickness of the glass substrate 210 can be less than 1 mm. Further, the circuit layer 220 is set on the substrate surface 212. The circuit layer 220 can be formed by a single conductive layer 222 as an interconnection structure (not shown in this figure), and the circuit layer 220 also can be formed by a plurality of conductive layer 222, at least a dielectric layer 224 and a conductive via 226. The conductive layers 222 are set on the substrate surface 212 in sequence. The dielectric layer 224 is set between two neighboring conductive layers 222 to isolate these two neighboring conductive layers 222. The conductive via 226 penetrates through the dielectric layer 224 and electrically connects the two neighboring conductive layers 222. The conductive layers 222 and the conductive via 226 constitute the interconnection structure.

Referring to FIG. 2A, the circuit layer 220 has a plurality of bonding pads 228a and bonding pads 228b. Both bonding pads 228a and bonding pads 228b are set on the surface of the circuit layer 220. The bonding pads 228a and bonding pads 228b are formed by the conductive layer 222 farthest from the substrate 210. The circuit layer 220 further includes a solder mask layer 229 on the surface of the circuit layer 220 to expose the bonding pads 228a and bonding pads 228b. Further, the die 230 has an active surface 232, a corresponding back side 234, and a plurality of die pads 236. The die pads 236 are set on the active surface 232, wherein the positions of the bonding pads 228a correspond to those of the die pads 236. Furthermore, a plurality of bumps 240 electrically and mechanically connects the bonding pads 228a and the die pads 236 so that the die 230 can electrically connect to the interconnection structure via the bumps 240. The balls 250 are set on the bonding pads 228b so that the die 230 can electrically and mechanically connect to external circuits via the bumps 240, the interconnection structure, and the balls 250. The insulated material 260 is applied between the circuit layer 220 and the die 230 to protect the exposed portions of the bumps 240.

Referring to FIG. 2A, the preferred embodiment of the present invention adopts a process almost the same as the process used to fabricate the LCD panels. The circuit layer 220 is fabricated on the substrate surface 212, wherein the material of the conductive layer 222 is comprised of a metal such as aluminum or copper, and the material of the dielectric layer 224 is comprised of a silicon nitride or a silicon oxide instead of conventional organic materials. It should be noted that when the material of the dielectric layer 224 is silicon nitride or silicon oxide and the conductive layer is fabricated on the dielectric layer 224, the line width and the line pitch would not be affected by the thermal expansion of the dielectric layer 224 so that the critical dimension for the line width and the line pitch can reach to 1.5 μm, which is much less than that of the conventional organic substrate (25 μm). When the density of the die pads becomes higher and higher, the line width and line pitch could be less than several micrometers. Hence the chip package structure of the present invention is more suitable for chips having high die pad density. In a preferred embodiment of the present invention, the line width and the line pitch can be set as around 6 μm and 1.5 μm respectively to carry enough current.

The equipment that is used fabricating LCD panels can also be used to fabricate the circuit layer 220 on the substrate surface 212 to form a high density bonding pads and circuit. It should be noted that the process of fabricating LCD panels is pretty mature. Hence, using LCD panel process to fabricate the chip package structure of the present invention can effectively reduce the production costs.

FIGS. 2B–2H show the cross-sectional views of other chip package structures 202–208 in accordance with preferred embodiments of the present invention.

Figure 1:
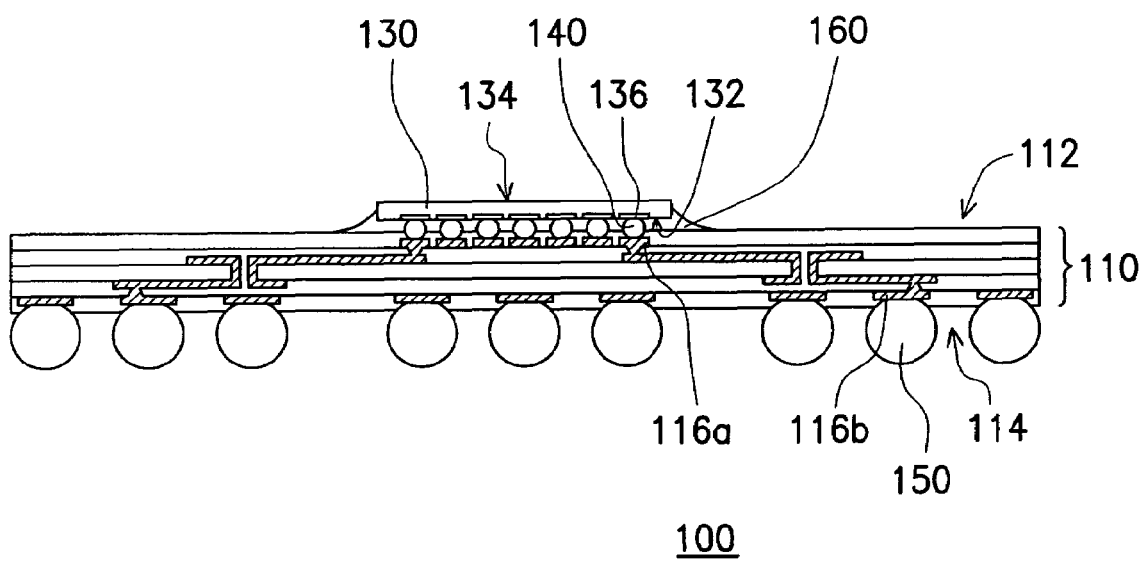
FIG. 1 is the cross-sectional view of a conventional FC/BGA chip package structure.
Figure 2B:
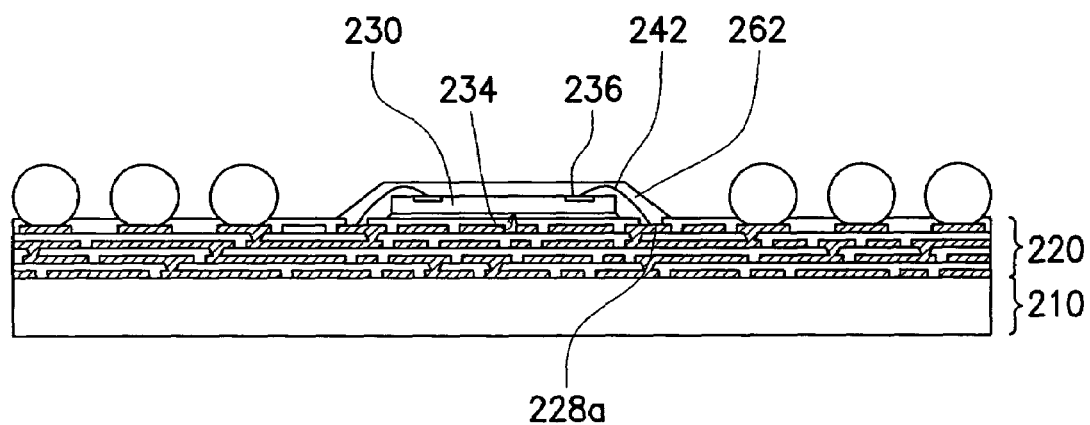

Referring to FIG. 2B, compared to the first chip package structure 201 in FIG. 2A, the second chip package structure 202 sets the back side of the die 230 on the circuit layer 220 and adopts wire bonding technology. The chip package structure 202 uses a plurality of conducting wires 242 instead of bumps 240 in FIG. 1 to electrically connect the die pads 236 and the bonding pads 238a so that the die 230 can electrically connect the interconnection structure in the circuit layer 220. Furthermore, a molding compound 262 is applied between the circuit layer 220 and the die 230 to protect the conducting wires 242, the die pads 236, and the bonding pads 228a.

Figure 2C:
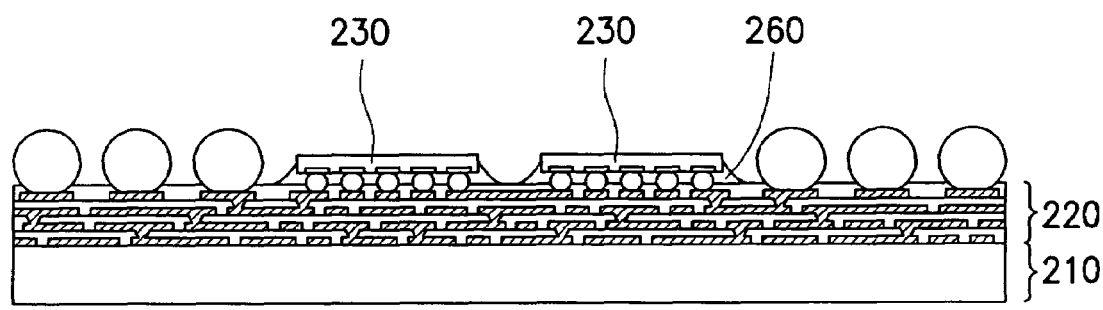
Figure 2D:
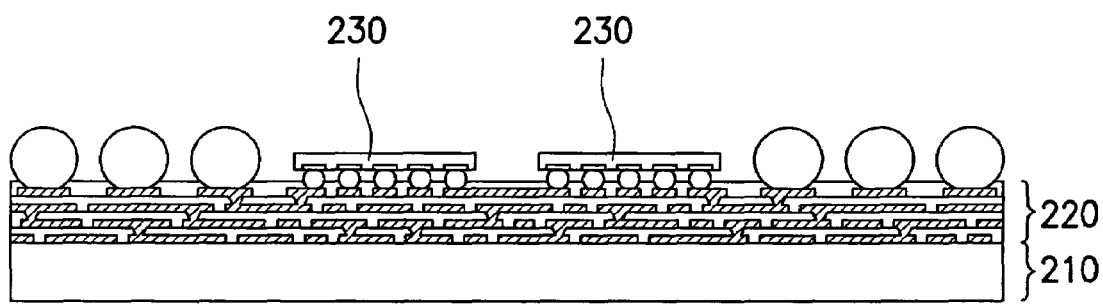

Referring to FIGS. 2C and 2D, compared to the first chip package structure 201 in FIG. 2A, the chip package structures 203 (in FIG. 2C) and 203 (in FIG. 2D) include a plurality of dies 230 and adopt flip chip technology to set the dies on the circuit layer 230. Furthermore, as shown in FIG. 2D, because the coefficients of the thermal expansion ("CTE") of the glass substrate 210, the dielectric layer 224 and the dies 230 are pretty close, when using the flip chip technology to set the dies 230 on the circuit layer 220, it is unnecessary to provide a stress buffer layer between the dies 230 and the circuit layer 220 (or the glass substrate 210). Hence, the insulated material 260 in FIG. 2C may be not required. Furthermore, because the chip package structure 203 can be applied to multiple dies 230, chip package structure 203 of the present invention can be applied to multi-chip module ("MCM") and system in package ("SIP")

Figure 2E:
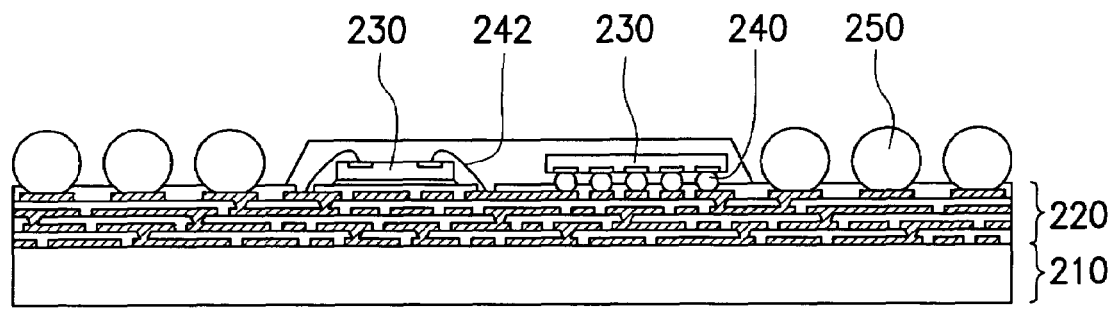

Referring to FIG. 2E, compared to the third chip package structure 203 in FIG. 2C, the fifth chip package structure 205 also has multiple dies 230 and uses flip chip technology and wire bonding technology to set the dies 230 on the circuit layer 220. Those dies 230 thus electrically connect to the interconnection structure of the circuit layer 220.

Figure 2F:
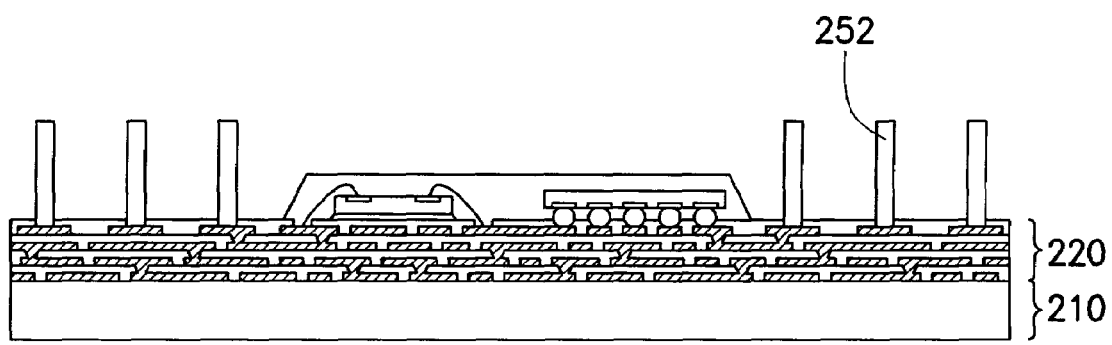

Referring to FIG. 2F, compared to the fifth chip package structure 205 in FIG. 2E, the sixth chip package structure 206 adopts pins 252 instead of balls 250 in FIG. 2E. Hence, the package type of the sixth chip package structure 206 is PGA. It should be noted that, in addition to pins and balls, other types of contacts also could be used to electrically and mechanically connect with the external circuits and devices.

Figure 2G:
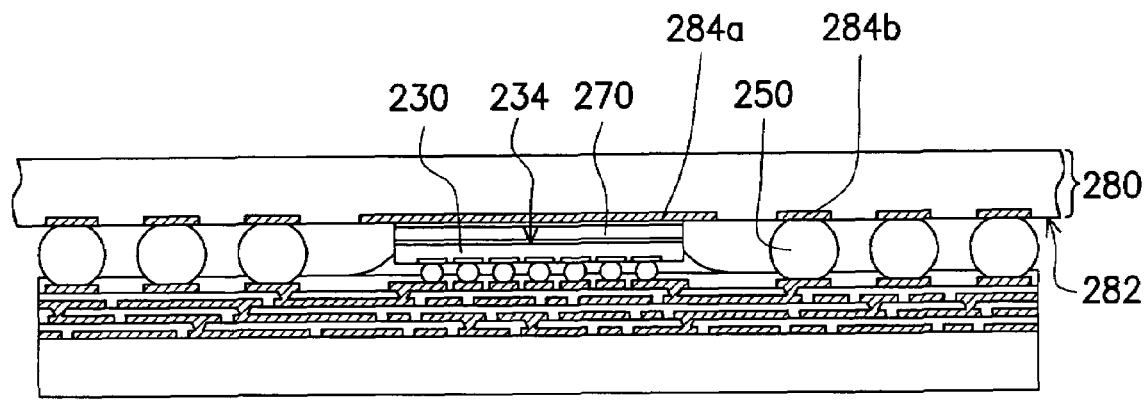

Referring to FIG. 2G, compared to the first chip package structure 201 in FIG. 2A, the seventh chip package structure 207 further comprises a heat spreader 270. The heat spreader 270 is set on the back side 234 of the die 230 to dissipate the heat generated by the die 230. Besides, the chip package structure 207 further comprises a carrier 280. The carrier 280 has a carrier surface 282, at least a first carrier pad 284a and a plurality of second carrier pads 284b. The die 230 indirectly connects to the first carrier pad 284a via heatspreader 270 so that the die 230 is between the glass substrate 210 and the carrier 280. Furthermore, when the carrier pad 284a is a ground pad and the heat spreader 270 is electrically conductive, the back side 234 of the die 230 can be electrically connected to the carrier pad 284a via the heat spreader 270. Moreover, when the back side 234 of the die 230 is close enough to the carrier pad 284a, the heat spreader 270 can be replaced by a conducting paste layer (not shown in this figure), wherein the heat spreader 270 and conducting paste layer are deemed to be a heat-conducting layer.

Figure 2H:
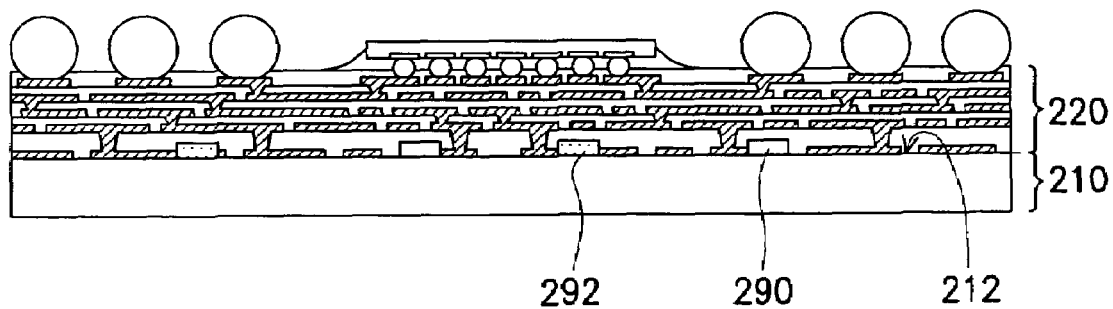

Referring to FIG. 2H, compared to the first chip package structure 201 in FIG. 2A, the eighth chip package structure 208 further comprises a plurality of active devices 290 inside the circuit layer 230 and on the substrate surface 212. Furthermore, the chip package structure 208 also can include a plurality of passive devices 292 such as resistors, capacitors or inductors inside the circuit layer 220, on the substrate surface 212 or on the surface of the circuit layer 220. It should be noted that the active devices 290 and the passive devices 292 could be fabricated on the substrate surface 212 by the LCD panel process and equipment. Furthermore, the interconnection structure of the circuit layer 220 can be used to form the passive devices 292. For example, the spiral routing of the interconnection structure can be used as an inductor.

The chip package structure of the present invention uses the glass substrate to replace the conventional organic substrate and uses the LCD panel process and equipment to form the circuit layer on the glass substrate. Then the flip chip or wire bonding technology is applied to set one or more dies on the circuit layer so that the die can electrically connect to the interconnection structure of the circuit layer. Furthermore, the chip package structure of the present invention also sets the pins, balls, or other contacts on the surface of the circuit layer and electrically connects those contacts to the interconnection structure so that the die can electrically connect to external circuits or devices. The chip package structure of the present invention can further set a heat spreader on the back side of the die as a heat-conducting layer to dissipate the heat generated by the die. Furthermore, the LCD panel process and equipment can fabricate the chip package structure of the present invention so that the present invention can effectively reduce the chip packaging costs.

Accordingly, the chip package structure of the present invention uses the LCD panel process and equipment to fabricate the circuit layer on the glass substrate. It should be noted that the critical dimensions of line width and pitch are about several micrometer for LCD panel process. When the die pad density of the die is getting higher and higher, the chip package structure of the present invention can be applied for a chip having high I/O density and fine circuits, which cannot be achieved by the conventional organic substrates. Furthermore, because the chip package structure of the present invention can be fabricated by the existing LCD panel process and equipment, the production costs of the chip package structure will be effectively reduced. Moreover, when the die pad density of the die increases, the die size may become smaller so that the number of dies on the same wafer increase and thus the cost per die is reduced. Therefore, the cost of the chip package structure is also reduced. Furthermore, the chip package structure of the present invention can be applied to package multi-dies at the same time and those dies can be electrically connected via the interconnection structures of the circuit layer. Hence, the chip package structure of the present invention can be applied to MCM or SIP.

The above description provides a full and complete description of the preferred embodiments of the present invention. Various modifications, alternate construction, and equivalent may be made by those skilled in the art without changing the scope or spirit of the invention. Accordingly, the above description and illustrations should not be construed as limiting the scope of the invention, which is defined by the following claims.

What is claimed is:

1. A chip package structure, comprising:
   a glass substrate having a substrate surface;
   a circuit layer on said substrate surface, wherein said circuit layer includes a plurality of first bonding pads and a plurality of second bonding pads on a surface of said circuit layer;
   at least a die having an active surface and a back side, wherein said die includes a plurality of die pads on said active surface;
   a plurality of bumps, wherein each of said bumps connects one of said die pads with one of said first bonding pads;
   a plurality of contacts disposed on said second bonding pads; and
   at least a passive device inside said circuit layer.

2. The chip package structure of claim 1, further comprising an insulated material applied between said circuit layer and said die.

3. The chip package structure of claim 1, wherein said circuit layer is a patterned conductive layer, which forms said first bonding pads and said second bonding pads.

4. The chip package structure of claim 1, wherein said circuit layer includes a plurality of patterned conductive layers, at least a dielectric layer and at least a conductive via, said conductive layers are set on said substrate surface, said dielectric layer is set between said conductive layers, said conductive via penetrating through said dielectric layer electrically connects said conductive layers, and one of said conductive layers farthest from said glass substrate forms said first bonding pads and said second bonding pads.

5. The chip package structure of claim 1, wherein said contacts are balls or pins.

6. The chip package structure of claim 1, further comprising at least an active device inside said circuit layer and disposed on said substrate surface.

7. The chip package structure of claim 1, wherein the passive device is disposed on said substrate surface.

8. The chip package structure of claim 1, further comprising at least a passive device on the surface of said circuit layer.

9. The chip package structure of claim 1, further comprising a heat-conducting layer on said back side of said die.

10. The chip package structure of claim 9, wherein said heat-conducting layer is a heat spreader or a conducting paste layer.

11. The chip package structure of claim 10, further comprising a carrier, wherein said carrier includes a carrier surface, at least a first carrier pad and a plurality of second carrier pads, and said die connects to said first carrier pad via said heat-conducting layer, and said contacts respectively connect to said second carrier pads.

12. The chip package structure of claim 10, wherein said heat-conducting layer includes electrically conductive material, and said first carrier pad is a ground pad so that said die is electrically coupled to said first carrier pad via said heat-conducting layer.

13. A chip package structure, comprising
   a glass substrate having a substrate surface;
   a circuit layer on said substrate surface, wherein said circuit layer includes a plurality of first bonding pads and a plurality of second bonding pads on the surface of said circuit layer;
   at least a die having an active surface and a back side, wherein said back side of said die is set on said circuit layer and said die includes a plurality of die pads on said active surface;
   a plurality of conducting wires, wherein each of said conducting wire connects one of said die pads with one of said first bonding pads; and a plurality of contacts disposed on said second bonding pads.

14. The chip package structure of claim 13, further comprising an insulated material covering said die and said conducting wires.

15. The chip package structure of claim 13, wherein said circuit layer is a patterned conductive layer, which forms said first bonding pads and said second bonding pads.

16. The chip package structure of claim 13, wherein said circuit layer includes a plurality of patterned conductive layers, at least a dielectric layer and at least a conductive via, said conductive layers are set on said substrate surface, said dielectric layer is set between said conductive layers, said conductive via penetrating through said dielectric layer electrically connects said conductive layers, and one of said conductive layers farthest from said glass substrate forms said first bonding pads and said second bonding pads.

17. The chip package structure of claim 13, wherein said contacts are balls or pins.

18. The chip package structure of claim 13, further comprising at least an active device inside said circuit layer and above said substrate surface.

19. The chip package structure of claim 13, further comprising at least a passive device inside said circuit layer.

20. The chip package structure of claim 13, further comprising at least a passive device on the surface of said circuit layer.

* * * * *